US007336986B2

(12) United States Patent
Miyoshi et al.

(10) Patent No.: US 7,336,986 B2
(45) Date of Patent: Feb. 26, 2008

(54) MAGNETIC RESONANCE IMAGING APPARATUS

(75) Inventors: Mitsuharu Miyoshi, Tokyo (JP); Susumu Kosugi, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 654 days.

(21) Appl. No.: 10/672,662

(22) Filed: Sep. 26, 2003

(65) Prior Publication Data

US 2004/0064035 A1 Apr. 1, 2004

(30) Foreign Application Priority Data

Oct. 1, 2002 (JP) ............................. 2002-288535

(51) Int. Cl.
*A61B 5/05* (2006.01)
*A61B 19/00* (2006.01)
*G01V 3/00* (2006.01)

(52) U.S. Cl. ................ 600/410; 600/407; 128/898; 324/307; 324/309; 324/312; 324/314

(58) Field of Classification Search ............... 600/407, 600/410; 324/307
See application file for complete search history.

(56) References Cited

U.S. PATENT DOCUMENTS

| | | | |
|---|---|---|---|
| 5,055,790 A | | 10/1991 | Siuciak et al. |
| 5,089,784 A | | 2/1992 | Yoshitome et al. |
| 5,134,372 A | * | 7/1992 | Inoue .......................... 324/309 |
| 5,170,122 A | | 12/1992 | Bernstein |
| 5,245,281 A | | 9/1993 | Yamada et al. |
| 5,349,295 A | | 9/1994 | Tokunaga |
| 5,352,979 A | | 10/1994 | Conturo |
| 5,560,360 A | * | 10/1996 | Filler et al. .................. 600/408 |
| 5,594,336 A | * | 1/1997 | Gullapalli et al. ........... 324/309 |
| 6,147,492 A | * | 11/2000 | Zhang et al. ................ 324/309 |
| 6,307,368 B1 | | 10/2001 | Vasanawala et al. |
| 6,452,387 B1 | * | 9/2002 | Hargreaves et al. ......... 324/300 |
| 6,580,272 B2 | | 6/2003 | Freed et al. |
| 6,714,807 B2 | * | 3/2004 | Zur .............................. 600/410 |

OTHER PUBLICATIONS

Zur et al., "Motion-Insensitive, Steady-State Free Precession Imaging." Dec. 1990, pp. 444-459.*
Klaus Scheffler, Ph.D, "Fat Saturated 3D TrueFISP: Magnetization Preparation during the Steady State," pp. 1-5.
Vasanawala et al., Linear Combination Steady-State Free Precession MRI; Magnetic Resonance in Medicine 43:82-90 (2000).
Bangerter et al.; SNR Analysis of Multiple Acquisition SSFP; Proc. Intl. Soc. Mag. Reson. Med. 10 (2002) 1 pg.

* cited by examiner

*Primary Examiner*—Brian L. Casler
*Assistant Examiner*—James Kish
(74) *Attorney, Agent, or Firm*—Armstrong Teasdale LLP

(57) ABSTRACT

An apparatus includes acquiring means for acquiring echo data of a plurality of views in which a phase difference between water and fat is $2\pi/m$ with spins within a subject brought to the SSFP state and repeating the acquisition for k=0 through M−1 with a step difference in a phase of an RF pulse of $2\pi \cdot k/M$; transforming means for conducting Fourier transformation on the echo data based on the phase step difference; separating means for separating water data and fat data respectively in F(0) term and F(1) term of the Fourier-transformed data using the phase difference between water and fat; adding means for obtaining a sum of absolute values of at least the water data or fat data in the F(0) term and F(1) term; and image producing means for producing an image based on the sum data.

19 Claims, 11 Drawing Sheets

MAGNETIC RESONANCE IMAGING APPARATUS

CROSS REFERENCE TO RELATED APPLICATIONS

This application claims the benefit of Japanese Application No. 2002-288535 filed Oct. 1, 2002.

BACKGROUND OF THE INVENTION

The present invention relates to a magnetic resonance imaging apparatus, and more particularly to an apparatus for conducting magnetic resonance imaging with spins within a subject brought to an SSFP (steady state free precession) state.

One conventional technique for conducting magnetic resonance imaging is a method of conducting magnetic resonance imaging with spins within a subject brought to an SSFP state. The method produces an image based on a sum of or a difference between echo data acquired with an RF (radio frequency) pulse having an invariant phase and echo data acquired with an RF pulse having a phase alternating between 0 and π (see, for example, Patent Document 1).

Conventional techniques for suppressing fat signals in magnetic resonance imaging include a method employing a fat suppression pulse (see, for example, Non-patent Document 1), and a method employing FEMR (fluctuating equilibrium magnetic resonance) (see, for example, Non-patent Document 2).

[Patent Document 1]
   Japanese Patent No. 2398329 (pages 1-9, FIGS. 1-5)
[Non-patent Document 1]
   Klaus Scheffler, et al., "Magnetization Preparation During the Steady State: Fat-saturated 3D TrueFISP," *Magnetic Resonance in Medicine*, 45:1075-1080 (2001).
[Non-patent Document 2]
   Shreyas S. Vasanawala, et al., "Fluctuating Equilibrium MRI," *Magnetic Resonance in Medicine*, 42: 1075-1080 (1999).

Images captured by the conventional techniques and by FEMR exhibit banding artifacts when the static magnetic field strength distribution is inhomogeneous.

Fat suppression by the aforementioned fat suppression pulses is unsuitable for imaging in the SSFP state because the steady state is disturbed.

SUMMARY OF THE INVENTION

It is therefore an object of the present invention to provide a magnetic resonance imaging apparatus for capturing an image free of banding artifacts in the SSFP state. Moreover, another object thereof is to provide a magnetic resonance imaging apparatus for conducting imaging in the SSFP state with water and fat separated.

The present invention, in accordance with one aspect thereof for solving the aforementioned problems, is a magnetic resonance imaging apparatus characterized in comprising: acquiring means for acquiring echo data of a plurality of views with spins within a subject brought to an SSFP state and repeating the acquisition for k=0 through M−1 (M being an integer not less than two; k=0, 1, . . . , M−1) with a step difference in a phase of an RF pulse of $2\pi \cdot k/M$; transforming means for conducting Fourier transformation on the echo data based on said phase; adding means for obtaining a sum of absolute values of F(0) term and F(1) term of the Fourier-transformed data; and image producing means for producing an image based on the sum data.

In the invention of this aspect, echo data of a plurality of views are acquired with spins within a subject brought to the SSFP state and the acquisition is repeated for k=0 through M−1 with a step difference in a phase of an RF pulse of $2\pi \cdot k/M$ by acquiring means; Fourier transformation is conducted on the echo data based on the phase by Fourier transforming means; a sum of absolute values of F(0) term and F(1) term of the Fourier-transformed data is obtained by adding means; and an image is produced based on the sum data by image producing means; thus, an image free of banding artifacts can be obtained in spite of magnetic field inhomogeneity.

The present invention, in accordance with another aspect thereof for solving the aforementioned problems, is a magnetic resonance imaging apparatus characterized in comprising: acquiring means for acquiring echo data of a plurality of views in which a phase difference between water and fat is $2\pi/m$ ($m \geq 2$) with spins within a subject brought to an SSFP state and repeating the acquisition for k=0 through M−1 (M being an integer not less than two; k=0, 1, . . . , M−1) with a step difference in a phase of an RF pulse of $2\pi \cdot k/M$; transforming means for conducting Fourier transformation on the echo data based on said phase; separating means for separating water data and fat data respectively in F(0) term and F(1) term of the Fourier-transformed data using the phase difference between water and fat; adding means for obtaining a sum of absolute values of at least the water data or fat data in the F(0) term and F(1) term; and image producing means for producing an image based on the sum data.

In the invention of this aspect, echo data of a plurality of views in which a phase difference between water and fat is $2\pi/m$ are acquired with spins within a subject brought to the SSFP state and the acquisition is repeated for k=0 through M−1 with a step difference in a phase of an RF pulse of $2\pi \cdot k/M$ by acquiring means; Fourier transformation is conducted on the echo data based on the phase by Fourier transforming means; water data and fat data are separated respectively in F(0) term and F(1) term of the Fourier-transformed data using the phase difference between water and fat by separating means; a sum of absolute values of at least the water data or fat data in the F(0) term and F(1) term is obtained by adding means; and an image is produced based on the sum data by image producing means; thus, an image in which water and fat are separated can e obtained. Moreover, an image free of banding artifacts can be obtained in spite of magnetic field inhomogeneity.

Preferably, the acquiring means acquires the echo data with an echo time TE of 1/m1 of a time at which the phase difference between water and fat reaches $2\pi$ so that the phase difference between water and fat in the F(0) term may be set to $2\pi/m1$.

Preferably, the acquiring means acquires the echo data with a difference between a pulse repetition time TR and an echo time TE of 1/m2 of a time at which the phase difference between water and fat reaches $2\pi$ so that the phase difference between water and fat in the F(1) term may be set to $-2\pi/m2$.

Preferably, m1=m2=4 so that the phase difference between water and fat may be set to $\pi/2$.

Preferably, the echo time TE is equal to the pulse repetition time TR multiplied by a (a=m2/(m1+m2)) so that the phase of fat relative to that of water may be in advance by $2\pi/m1$ in the F(0) term and behind by $2\pi/m2$ in the F(1) term.

Preferably, the echo time TE is ½ (m1=m2=m) of the pulse repetition time TR so that the phase of fat relative to that of water may be in advance by 2π/m in the F(0) term and behind by 2π/m in the F(1). term.

Preferably, the separating means separates water data and fat data after correcting a phase error in the Fourier-transformed data due to magnetic field inhomogeneity so that the separation into water and fat may be suitably achieved.

Preferably, the separating means corrects the phase error by a phase distribution multiplied by 1/m, after multiplying the phase of the Fourier-transformed data by m to make water and fat in phase and correcting wraparound of a portion beyond a range of ±π so that the phase error correction may be suitably achieved.

Preferably, the adding means obtains a sum of absolute values of the water data in the F(0) term and F(1) term so that a water image may be obtained.

Preferably, the adding means obtains a sum of absolute values of the fat data in the F(0) term and F(1) term so that a fat image may be obtained.

Preferably, the adding means obtains respective sums of absolute values of the water data and fat data in the F(0) term and F(1) term, and the image producing means produces respective images based on the respective sum data so that water and fat images may be obtained.

Preferably, M=4 so that four kinds of step difference in the phase of the RF pulse may be obtained.

Preferably, the transforming means conducts Fourier transformation from the F(0) term to F(1) term so that the time for the transformation may be reduced.

Preferably, the apparatus further comprises correcting means for correcting a phase offset and a time offset between a gradient echo and a spin echo so that imaging in the SSFP state may be suitably achieved.

Preferably, the correcting means corrects the phase offset and the time offset by finding them from a phase and an echo time of the gradient echo when the phase of the spin echo is reset by a crusher, and a phase and an echo time of the spin echo when the phase of the gradient echo is reset by a crusher so that the correction may be suitably achieved.

Preferably, the correcting means corrects the phase offset by the phase of the RF pulse, and corrects the time offset by a gradient magnetic field so that the correction may be suitably achieved.

Therefore, the present invention provides a magnetic resonance imaging apparatus for capturing an image free of banding artifacts in the SSFP state. Moreover, it provides a magnetic resonance imaging apparatus for conducting imaging in the SSFP state with water and fat separated.

Further objects and advantages of the present invention will be apparent from the following description of the preferred embodiments of the invention as illustrated in the accompanying drawings.

DETAILED DESCRIPTION OF THE INVENTION

Figure 1:
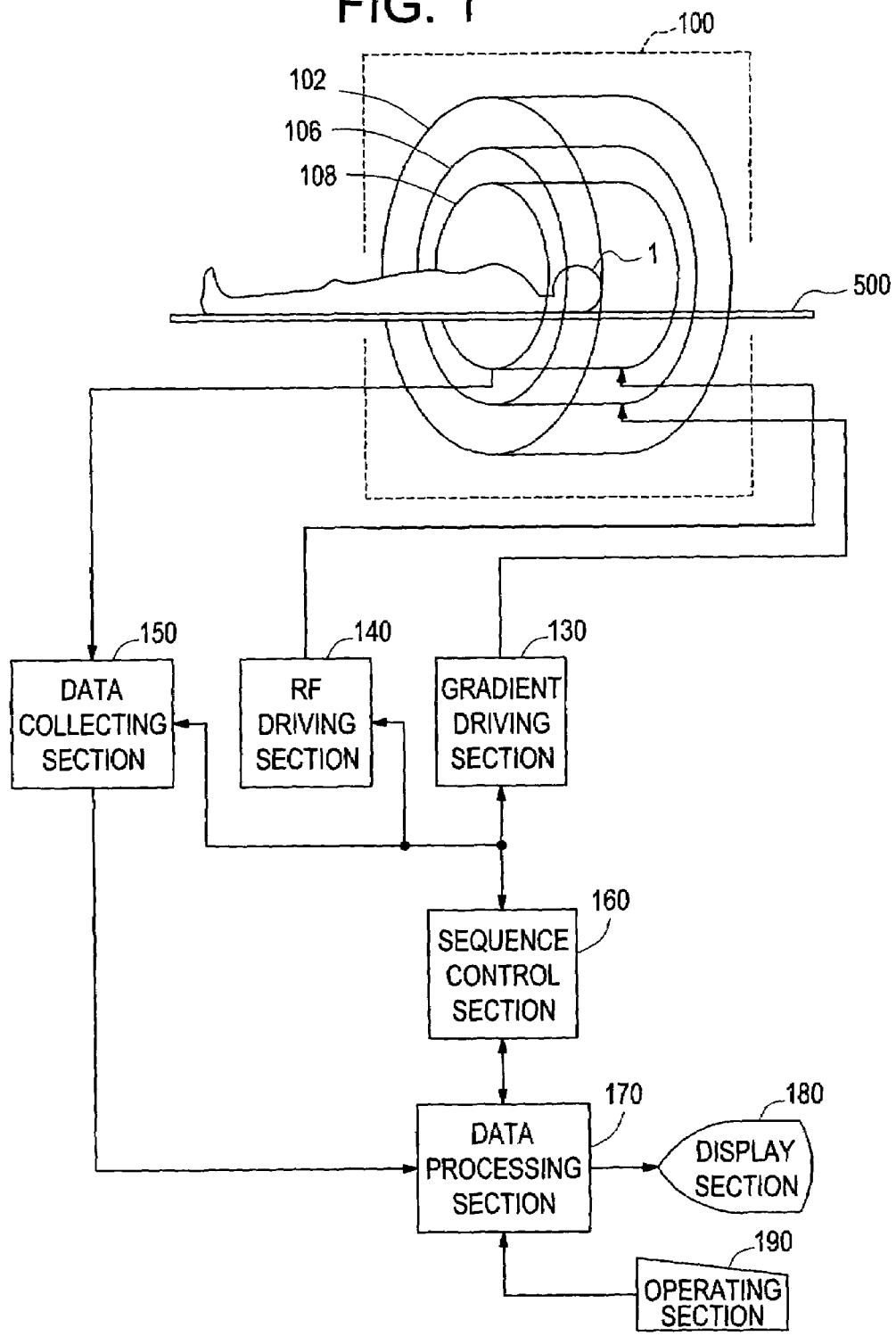
FIG. 1 is a block diagram of an apparatus in accordance with one embodiment of the present invention.

Embodiments of the present invention will now be described in detail with reference to the accompanying drawings. FIG. 1 shows a block diagram of a magnetic resonance imaging apparatus, which is an embodiment of the present invention. The configuration of the apparatus represents an embodiment of the apparatus in accordance with the present invention.

As shown in FIG. 1, the present apparatus has a magnet system 100. The magnet system 100 has a main magnetic field coil section 102, a gradient coil section 106, and an RF coil section 108. These coil sections have a generally cylindrical shape and are concentrically disposed. A subject to be imaged 1 is rested on a cradle 500 and carried into and out of a generally cylindrical internal space (bore) of the magnet system 100 by carrier means, which is not shown.

The main magnetic field coil section 102 generates a static magnetic field in the internal space of the magnet system 100. The direction of the static magnetic field is generally in parallel with the direction of the body axis of the subject 1. That is, a magnetic field commonly referred to as a horizontal magnetic field is generated. The main magnetic field coil section 102 is made using a superconductive coil, for example. However, the main magnetic field coil section 102 is not limited to the superconductive coil, but may be made using a normal conductive coil or the like.

The gradient coil section 106 generates three gradient magnetic fields for imparting gradients to the static magnetic field strength in directions of three mutually perpendicular axes, i.e., a slice axis, a phase axis, and a frequency axis.

When mutually perpendicular coordinate axes in the static magnetic field space are represented as X, Y, and Z, any one of the axes may be the slice axis. In this case, one of the two remaining axes is the phase axis and the other is the frequency axis. Moreover, the slice, phase, and frequency axes can be given arbitrary inclination with respect to the X-, Y-, and Z-axes while maintaining their mutual perpendicularity. In the present apparatus, the direction of the body axis of the subject 1 is defined as the Z-axis direction.

The gradient magnetic field in the slice axis direction is sometimes referred to as the slice gradient magnetic field. The gradient magnetic field in the phase axis direction is sometimes referred to as the phase encoding gradient magnetic field. The gradient magnetic field in the frequency axis direction is sometimes referred to as the readout gradient magnetic field. The readout gradient magnetic field is synonymous with the frequency encoding gradient magnetic field. In order to enable generation of such gradient magnetic fields, the gradient coil section 106 has three gradient coils, which are not shown. The gradient magnetic field will be sometimes referred to simply as the gradient hereinbelow.

The RF coil section 108 generates a radio frequency magnetic field in the static magnetic field space for exciting spins within the subject 1. The generation of the radio frequency magnetic field will be sometimes referred to as transmission of an RF excitation signal hereinbelow. Moreover, the RF excitation signal will be sometimes referred to as the RF pulse. Electromagnetic waves, i.e., magnetic resonance signals, generated by the excited spins are received by the RF coil section 108.

The magnetic resonance signals are those in a frequency domain, i.e., in a Fourier space. Since the magnetic resonance signals are encoded in two axes by the gradients in the phase- and frequency-axis directions, the magnetic resonance signals are obtained as signals in a two-dimensional Fourier space. The phase encoding gradient and readout gradient are used to determine a position at which a signal is sampled in the two-dimensional Fourier space. The two-dimensional Fourier space will be sometimes referred to as the k-space hereinbelow.

The gradient coil section 106 is connected with a gradient driving section 130. The gradient driving section 130 supplies driving signals to the gradient coil section 106 to generate the gradient magnetic fields. The gradient driving section 130 has three driving circuits, which are not shown, corresponding to the three gradient coils in the gradient coil section 106.

The RF coil section 108 is connected with an RF driving section 140. The RE driving section 140 supplies driving signals to the RF coil section 108 to transmit the RF pulse, thereby exciting the spins within the subject 1.

The RF coil section 108 is connected with a data collecting section 150. The data collecting section 150 collects signals received by the RF coil section 108 as digital data.

The gradient driving section 130, RF driving section 140 and data collecting section 150 are connected with a sequence control section 160. The sequence control section 160 controls the gradient driving section 130, RF driving section 140 and data collecting section 150 to carry out the collection of magnetic resonance signals.

The sequence control section 160 is, for example, constituted using a computer. The sequence control section 160 has a memory, which is not shown. The memory stores programs for the sequence control section 160 and several kinds of data. The function of the sequence control section 160 is implemented by the computer executing a program stored in the memory.

The output of the data collecting section 150 is connected to a data processing section 170. Data collected by the data collecting section 150 are input to the data processing section 170. The data processing section 170 is, for example, constituted using a computer. The data processing section 170 has a memory, which is not shown. The memory stores programs for the data processing section 170 and several kinds of data.

The data processing section 170 is connected to the sequence control section 160. The data processing section 170 is above the sequence control section 160 and controls it. The function of the present apparatus is implemented by the data processing section 170 executing a program stored in the memory.

The data processing section 170 stores the data collected by the data collecting section 150 into the memory. A data space is established in the memory. The data space corresponds to the k-space. The data processing section 170 performs two-dimensional inverse Fourier transformation on the data in the k-space to reconstruct an image.

The data processing section 170 is connected with a display section 180 and an operating section 190. The display section 180 comprises a graphic display, etc. The operating section 190 comprises a keyboard, etc., provided with a pointing device.

The display section 180 displays the reconstructed image output from the data processing section 170 and several kinds of information. The operating section 190 is operated by a user, and the section 190 inputs several commands, information and so forth to the data processing section 170. The user interactively operates the present apparatus via the display section 180 and operating section 190.

Figure 2:
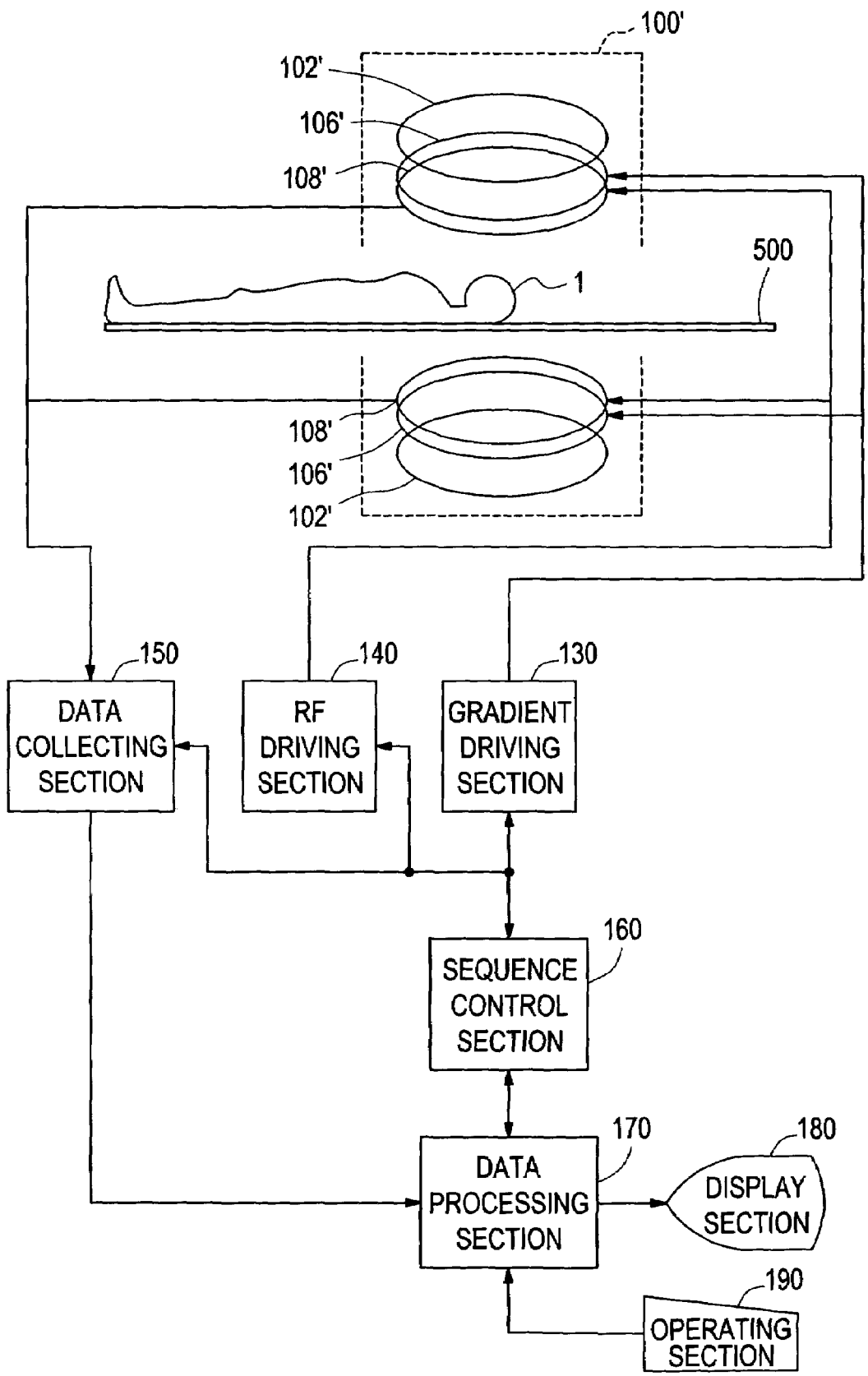
FIG. 2 is a block diagram of an apparatus in accordance with another embodiment of the present invention.

FIG. 2 shows a block diagram of a magnetic resonance imaging apparatus of another type, which is one embodiment of the present invention.

The configuration of the apparatus represents an embodiment of the apparatus in accordance with the present invention.

The present apparatus has a magnet system 100' of a type different from that of the apparatus shown in FIG. 1. Since the apparatus has a configuration similar to that of the apparatus shown in FIG. 1 except for the magnet system 100', similar portions are designated by similar reference numerals and the explanation thereof will be omitted.

The magnet system 100' has a main magnetic field magnet section 102', a gradient coil section 106', and an RE coil section 108'. The main magnetic field magnet section 102' and the coil sections each include a pair of members facing each other across a space. These sections have a generally disk-like shape and are disposed to have a common center axis. A subject 1 is rested on a cradle 500 and carried into and out of an internal space (bore) of the magnet system 100' by carrier means, which is not shown.

The main magnetic field magnet section 102' generates a static magnetic field in the internal space of the magnet system 100'. The direction of the static magnetic field is generally orthogonal to the direction of the body axis of the subject 1. That is, a magnetic field commonly referred to as a vertical magnetic field is generated. The main magnetic field magnet section 102' is made using a permanent magnet, for example. However, the main magnetic field magnet section 102' is not limited to a permanent magnet, but may be made using a super or normal conductive electromagnet or the like.

The gradient coil section 106' generates three gradient magnetic fields for imparting gradients to the static magnetic field strength in directions of three mutually perpendicular axes, i.e., a slice axis, a phase axis and a frequency axis.

When mutually perpendicular coordinate axes in the static magnetic field space are represented as X, Y, and Z, any one of the axes may be the slice axis. In this case, one of the two remaining axes is the phase axis and the other is the frequency axis. Moreover, the slice, phase, and frequency axes can be given arbitrary inclination with respect to the X-, Y-, and Z-axes while maintaining their mutual perpendicularity. In the present apparatus, the direction of the body axis of the subject 1 is again defined as the Z-axis direction.

The gradient magnetic field in the slice axis direction is sometimes referred to as the slice gradient magnetic field. The gradient magnetic field in the phase axis direction is sometimes referred to as the phase encoding gradient magnetic field. The gradient magnetic field in the frequency axis direction is sometimes referred to as the readout gradient magnetic field. The readout gradient magnetic field is synonymous with the frequency encoding gradient magnetic field. In order to enable generation of such gradient magnetic fields, the gradient coil section 106' has three gradient coils, which are not shown.

The RF coil section 108' transmits an RF pulse to the static magnetic field space for exciting spins within the subject 1. Electromagnetic waves, i.e., magnetic resonance signals, generated by the excited spins are received by the RF coil section 108'. The signals received by the RF coil section 108' are input to the data collecting section 150.

Figure 3:
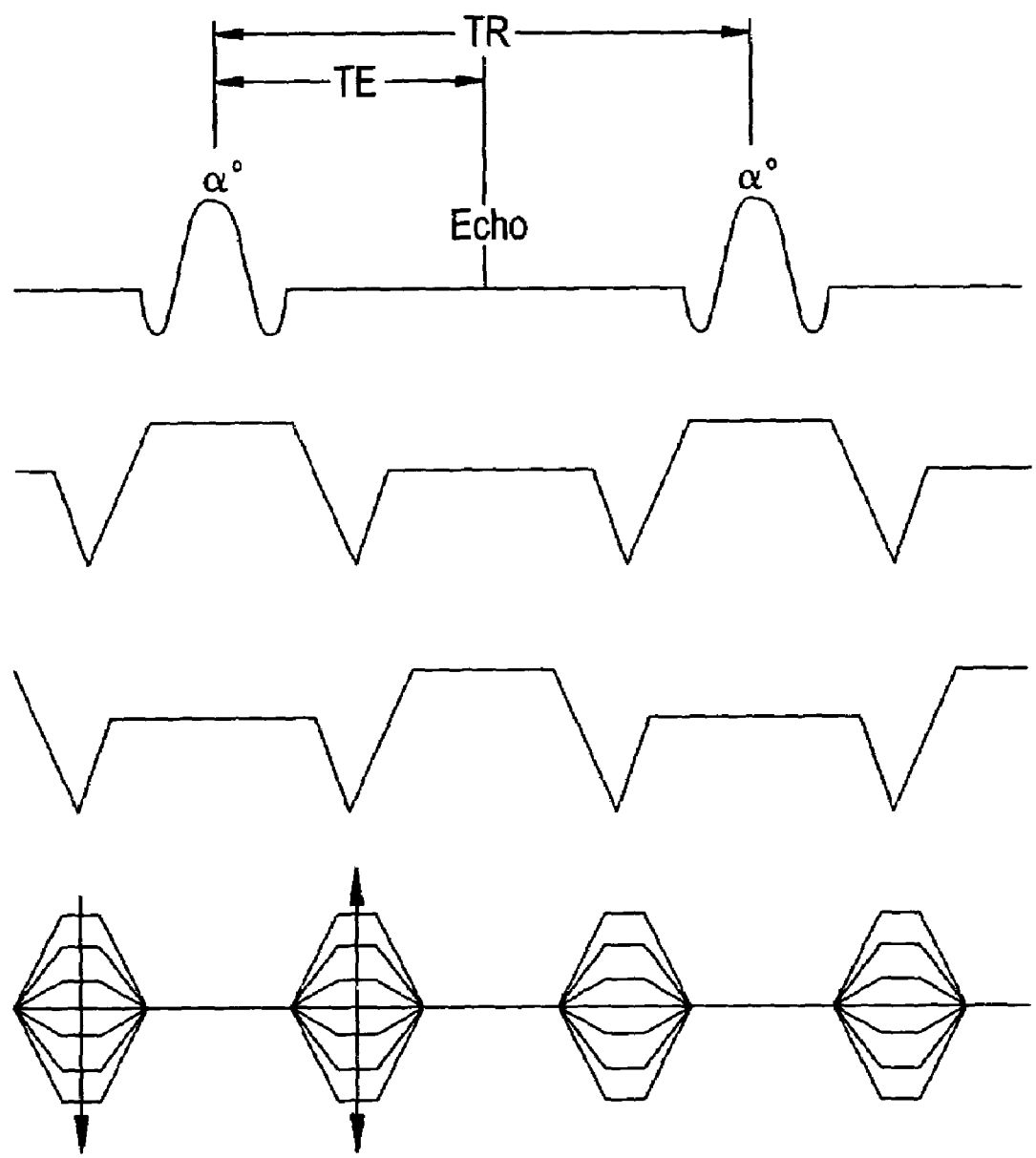
FIG. 3 shows an exemplary pulse sequence executed by the apparatus in accordance with one embodiment of the present invention.

FIG. 3 shows a pulse sequence for a scan in the SSFP state. The pulse sequence proceeds from the left to the right. In FIG. 3, (1) shows a pulse sequence of RF pulses. (2)-(4) show pulse sequence of gradient magnetic fields. (2) is the slice gradient, (3) is the frequency encoding gradient, and (4) is the phase encoding gradient. The static magnetic field is constantly applied at a fixed magnetic field strength.

As shown, spin excitation is effected by an $\alpha°$ pulse. The spin excitation is selective excitation under a slice gradient Gslice. The spin excitation is repeated in a cycle of TR. The cycle TR is also referred to as a pulse repetition time. The pulse repetition time will be sometimes referred to simply as TR hereinbelow. 1TR corresponds to one view.

An echo is read by a frequency encoding gradient Gfreq applied during 1TR. The echo is represented by its center signal. A time period from a center of an $\alpha°$ pulse to an echo center is an echo time TE. The echo time will be sometimes referred to simply as TE hereinbelow.

Generally, the frequency encoding gradient Gfreq is designed so that TE=TR/2 holds. When imaging is to be conducted with water and fat separated, TE is further set to 1/m of the time at which the phase difference between water and fat reaches $2\pi$. This is achieved by setting TR. The value of m is four, for example. In this case, the phase difference between water and fat is $\pi/2$. However, m is not limited to four.

Phase encoding gradients Gphase are applied immediately after spin excitation and immediately before next spin excitation during 1TR. These two phase encoding gradients Gphase have magnitudes and polarities symmetric with each other. Thus, the preceding phase encoding gradient Gphase winds up phase encoding and the following phase encoding gradient Gphase rewinds the phase encoding. The amount of phase encoding is changed for every 1TR.

Figure 4:
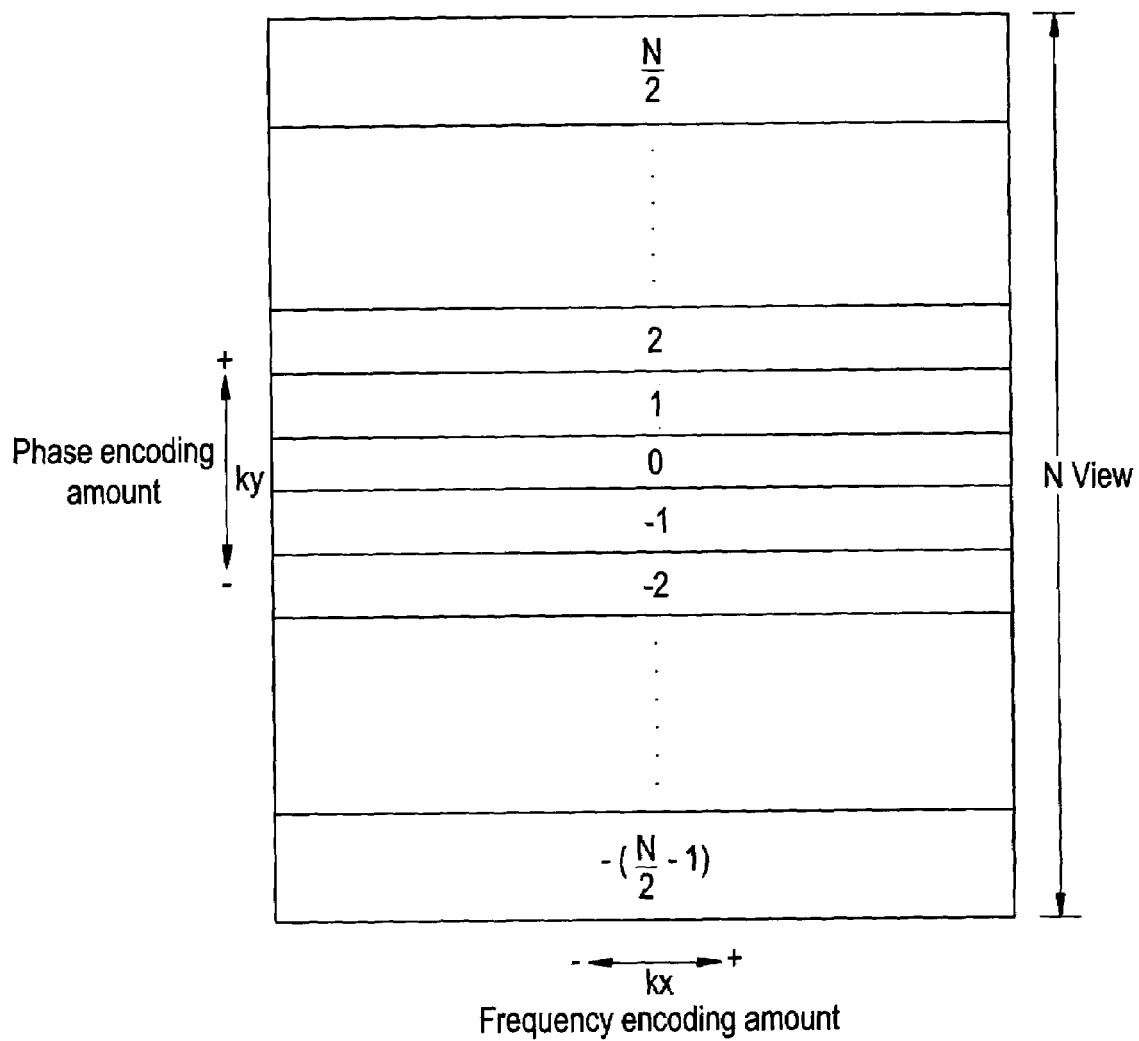
FIG. 4 shows a k-space.

By reading echoes by the phase encoding and frequency encoding, data in a k-space are sampled. FIG. 4 shows a conceptual diagram of the k-space. As shown, the horizontal axis kx of the k-space is a frequency axis, and the vertical axis ky is a phase axis.

In FIG. 4, each of a plurality of laterally extending rectangles represents a data sampling position on the phase axis. The number shown in each rectangle represents the amount of phase encoding. The amounts of phase encoding are normalized by $\pi/N$. N is the number of sampling points in the phase axis direction. The number of sampling points in the phase direction is also referred to as the number of views.

The amount of phase encoding is zero at the center of the phase axis ky. The amount of phase encoding increases from the center to both ends. The polarities of the increases are opposite to each other. The sampling interval, i.e., the step difference between the amounts of phase encoding is $\pi/N$.

In the present apparatus, such data collection is conducted with the phase of the $\alpha°$ pulse changed by $2\pi\cdot k/M$ for every 1TR. $2\pi\cdot k/M$ represents the step difference of the phase of the $\alpha°$ pulse per 1TR. M is an integer not less than two.

Moreover, k=0, 1, . . . , M−1.

When k=0, the step difference is zero. Therefore, no change is made in the phase of the $\alpha°$ pulse and spin excitation is conducted at the same phase every time. Under such excitation, one group of data for the k-space is collected. The data of this group will be designated as f(0) hereinbelow.

When k=1, the step difference is $2\pi/M$. Therefore, spin excitation is conducted with the phase of the $\alpha°$ pulse changed by $2\pi/M$ for every 1TR. Under such excitation, another group of data for the k-space is collected. The data of this group will be designated as f(1) hereinbelow.

When k=2, the step difference is $4\pi/M$. Therefore, spin excitation is conducted with the phase of the $\alpha°$ pulse changed by $4\pi/M$ for every 1TR. Under such excitation, still another group of data for the k-space is collected. The data of this group will be designated as f(2) hereinbelow.

Thereafter, groups of data for the k-space are collected in this manner until k reaches k=M−1. Thus, M groups of data f(0), f(1), f(2), . . . , f(M−1) are collected. Such data collection will be referred to as a phase cycle process hereinbelow.

In the phase cycle process, each group of data is designated as f(k). For example, if M is four, four groups of data f(0), f(1), f(2) and f(3) are collected. However, M is not limited to four.

The data f(k) obtained by the phase cycle process is given by the following equation:

[Equation 1]

$$f(k) = \frac{A(1 - E_2 \exp i\xi)}{B(1 - E_2 \cos\xi) - C(E_2 - \cos\xi)} E_3 \exp\left(i \frac{\theta_{chem} + \theta}{2}\right), \quad (1)$$

$$\xi = \phi - \theta - \theta_{chem}$$
$$A = M_0(1 - E_1)\sin\alpha$$
$$B = 1 - E_1 \cos\alpha$$
$$C = E_2(E_1 - \cos\alpha)$$
$$E_1 = \exp(-TR/T_1)$$
$$E_2 = \exp(-TR/T_2)$$
$$E_3 = \exp(-TR/2/T_2^*)$$
$$\phi = 2\pi k/M$$

where $\xi$ represents the phase of spins. In $\xi$ are contained the phase of the $\alpha°$ pulse $\phi$, the phase error $\theta$ due to magnetic field inhomogeneity, susceptibility or the like, and the phase $\theta$chem due to chemical shift. M0 represents initial magnetization.

Assuming that $E1 \cong 1$, the coefficient of cos $\xi$ (−BE2+C=E2 (1+cos $\alpha$) (E1−1)) in the denominator of Equation (1) is approximately zero, and therefore, Equation (1) can be simplified as:

[Equation 2]

$$f(k) = \text{constant}(1 - E_2 \exp i\xi) \exp\left(i \frac{\theta_{chem} + \theta}{2}\right). \quad (2)$$

In producing an image, Fourier transformation is conducted on the M groups of data. The Fourier transformation is conducted based on the phase difference $2\pi\cdot k/M$. Specifically,

[Equation 3]

$$F(n) = \sum_{k=0}^{M-1} f(k)\exp\left(-i\frac{2\pi}{M}n\cdot k\right). \quad (3)$$

By the Fourier transformation according to Equation (3), F(0), F(1), F(2), F(3), ... are obtained corresponding to n=0, 1, 2, 3, ....

Figure 5:
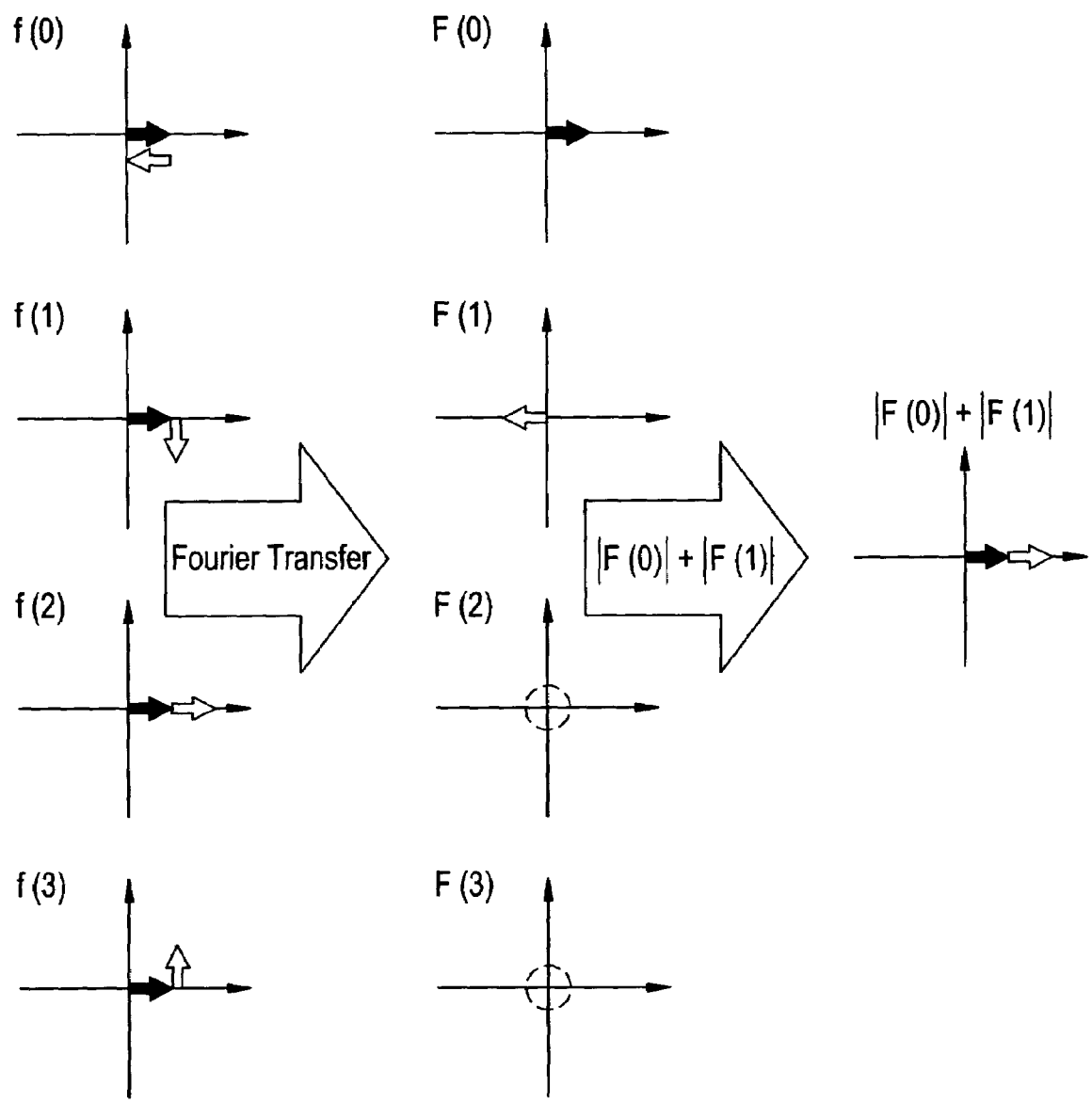
FIG. 5 is a diagram showing data as vectors.

FIG. 5 shows f(k) and its Fourier transformation. F(n) depicted by vectors. In FIG. 5, M=4 as one example. Therefore, k=0, 1, 2, 3. As for n, 0 through 3 are shown. For simplification, θ=0 is assumed here.

Solid vectors represent the constant term in Equation (2) (constant×exp (i (θchem+θ)/2)), and hollow vectors represent the exp iξ term (constant×(E2 exp iξ)×exp (i (θchem+θ)/2)). It should be noted that f(k) is assumed to be water data here.

As shown, the constant terms in f(0)-f(3) are vectors all having the same phase. On the other hand, the exp iξ terms are different for f(0)-f(3). Specifically, the term is at a phase opposite to that of the constant term for the f(0) term, at a phase of −π/2 for the f(1) term, at the same phase for the f(2) term, and at a phase of π/2 for the f(3) term.

By Fourier-transforming such f(0)-f(3), data having the same phase as that of normal GRE (gradient echo) signal data is obtained as the F(0) term. The phase of the vector is zero. Moreover, data having the same phase as that of normal inverse GRE signal data is obtained as the F(1) term. The phase of the vector is π. Such F(0) and F(1) terms have a property of being rather unaffected by the phase error θ.

Higher-order terms from the F(2) term are data corresponding to added GRE and inverse GRE signals after adding the phase error θ thereto a plurality of times, and therefore, the higher-order terms have a property of being highly affected by the phase error θ.

Thus, in the present apparatus, absolute values of only the F(0) and F(1) terms are added. Since the F(0) and F(1) terms have a property of being rather unaffected by the phase error θ, the added absolute value is little affected by the phase error θ.

By the processing as described above, data little affected by the phase error θ can be obtained. By conducting two-dimensional inverse Fourier transformation on such data, a tomographic image is reconstructed. Since the effect of the phase error θ on data is slight, the image contains no banding artifacts in spite of magnetic field inhomogeneity.

The image reconstruction may be conducted using only one of the F(0) and F(1) term. However, it is preferable to employ the sum of absolute values thereof because the signal intensity is enhanced.

The same result can be obtained by conducting two-dimensional inverse Fourier transformation on each of f(0)-f(3), then conducting the Fourier transformation as described above, and adding absolute values of F(0) and F(1) terms therefrom. Moreover, it is easily recognized that an image of only the F(0) or F(1) term may be produced.

Moreover, Fourier transformation may be conducted from the F(0) term to F(1) term because higher-order terms from F(2) are not employed. This can significantly reduce the calculation time.

Figure 6:
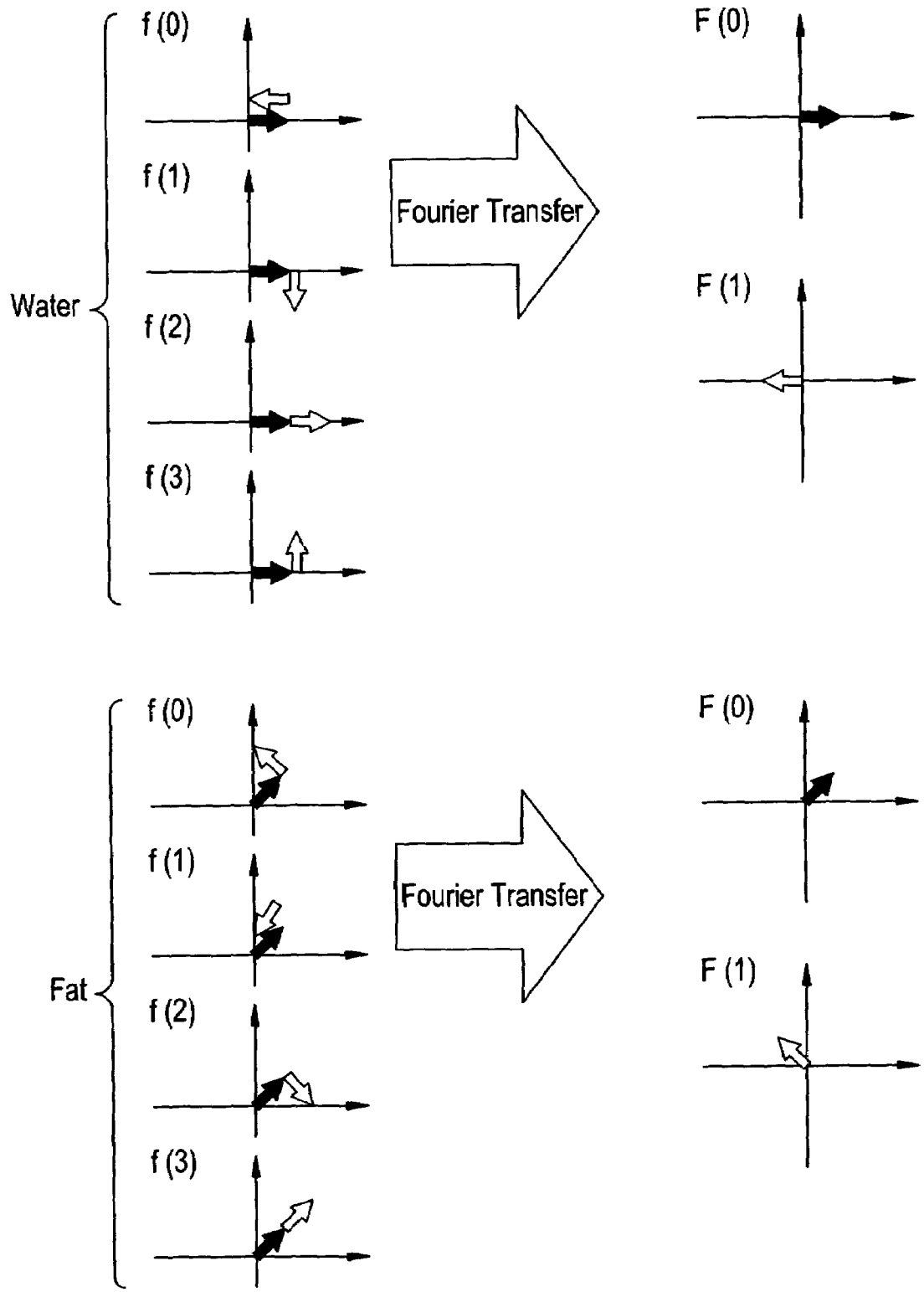
FIG. 6 is a diagram showing data as vectors.

FIG. 6 shows f(0)-f(3) and their Fourier transformation F(0) and F(1) when water and fat are present together depicted by vectors. Terms from F(2) are omitted from the drawing. Here, θchem=π/2. This corresponds to m=8. Note that θchem/2=2π/m.

As shown, the vectors are the same as those shown in FIG. 5 for water. For fat, the constant terms in f(0)-f(3) are vectors all having the same phase. However, they have a phase difference relative to water due to chemical shift.

The exp iξ term is different for each of f(0)-f(3). Specifically, it is at a phase of π/2 relative to the constant term for f(0), at an opposite phase for the f(1) term, at a phase of −π/2 for f(2), and at the same phase for f(3).

By Fourier-transforming such f(0)-f(3), the F(0) term becomes a vector having a phase in advance by θchem/2 relative to that of water in F(0). Moreover, the F(1) term becomes a vector having a phase behind by θchem/2 relative to that of water in F(1). Such terms F(0) and F(1) of fat also have a property of being rather unaffected by the phase error θ.

Thus, water and fat are separated for F(0) using the phase difference +θchem/2 between water and fat. Moreover, they are separated for F(1) using the phase difference −θchem/2 between water and fat.

A technique for separating water and fat using a phase difference is described in Japanese Patent Application Laid Open No. 2001-414, and is known in the art. The technique is sometimes referred to as SQFWI (single quadrature fat water imaging).

In SQFWI, after multiplication of the phase of echo data by m to put water and fat in phase and correction of wraparound of a portion beyond a range of ±π, the phase error in the echo data is corrected by a phase distribution multiplied by 1/m, whereafter water and fat are separated based on the phase difference between water data and fat data so that the separation of water and fat may be accurately achieved.

Figure 7:
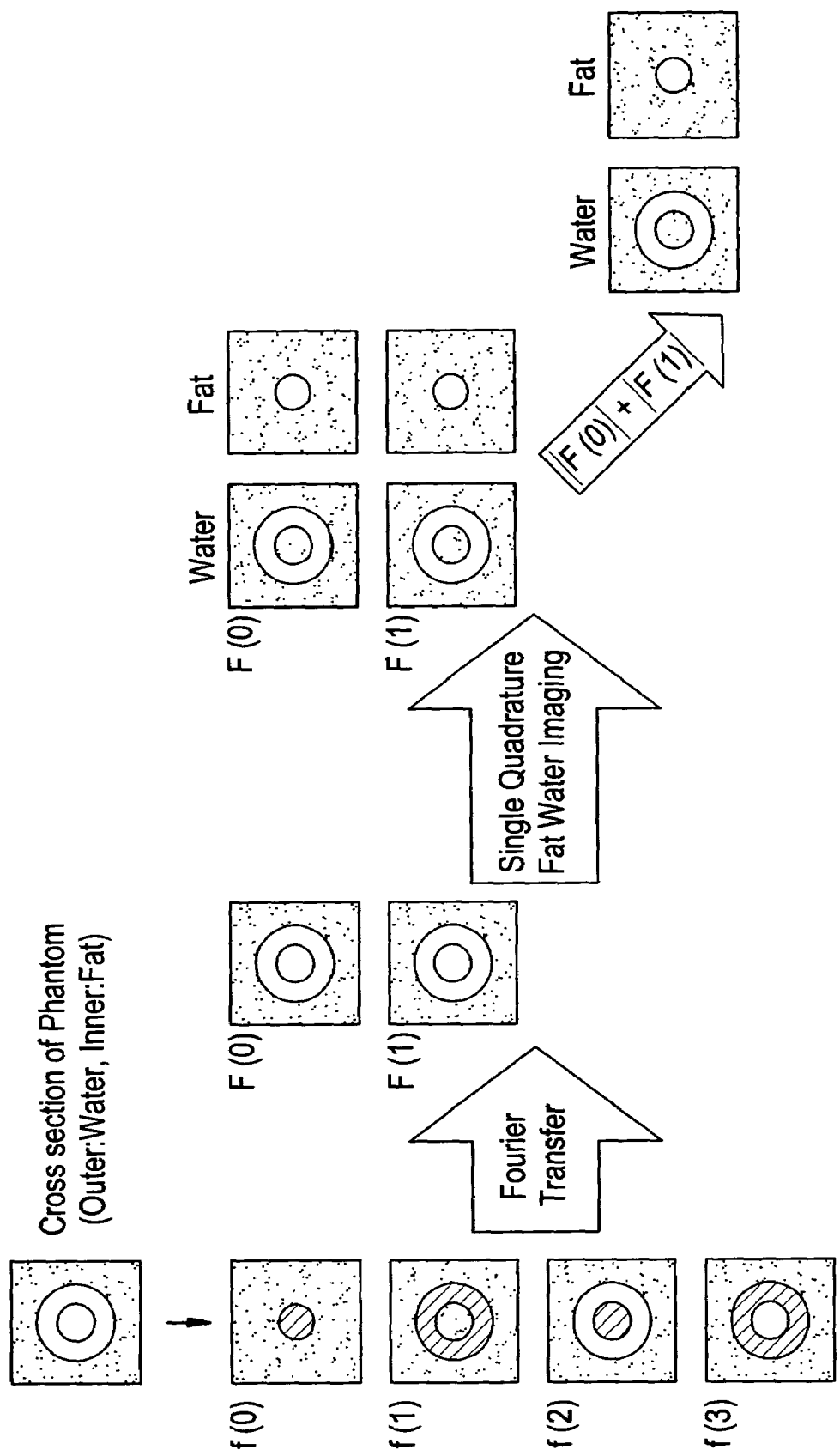
FIG. 7 shows a concept of water/fat separation.

FIG. 7 shows a conceptual diagram of data processing from the Fourier transformation to water/fat separation by SQFWI. FIG. 7 shows a case in which a phantom having an outer concentric circle of water and an inner concentric circle of fat is imaged.

As shown, f(0) is data of only fat substantially free of water. However, the fat data has reduced signal intensity. This is represented by hatching. The reason why this occurs is that vectors of water and fat are as shown in FIG. 6.

f(1) is data of only water substantially free of fat. However, the water data has reduced signal intensity. This is represented by hatching. The reason why this occurs is that vectors of water and fat are as shown in FIG. 6.

f(2) is data including data of water and fat. However, the fat data has reduced signal intensity. This is represented by hatching. The reason why this occurs is that vectors of water and fat are as shown in FIG. 6.

f(3) is data including data of water and fat. However, the water data has reduced signal intensity. This is represented by hatching. The reason why this occurs is that vectors of water and fat are as shown in FIG. 6.

F(0) and F(1) obtained by Fourier-transforming f(0)-f(3) include data of water and fat at original signal intensity. However, the phase of fat relative to that of water is +θchem/2 for F(0), and is −θchem/2 for F(1).

By separating water and fat in F(0) and F(1) using SQFWI, water data and fat data are respectively obtained. Then, water data having high signal intensity is obtained as the sum of absolute values of water data in F(0) and F(1). Moreover, fat data having high signal intensity is obtained as the sum of absolute values of fat data in F(0) and F(1).

It is obvious that the water and fat data may be obtained from only one of F(0) and F(1). Moreover, both of water and fat are not necessarily obtained but only one of water and fat may be obtained.

The echo time TE may be TR multiplied by a (a=m2/(m1+m2)), instead of TR/2 as indicated above. In this case, an echo signal f(k) is given by the following equation:

[Equation 4]

$$f(k) = \frac{A(1 - E_2 \exp i\xi)}{B(1 - E_2 \cos\xi) - C(E_2 \cos\xi)} \exp(aTR/T_2^*) \times \exp(ia\theta_{chem} + \theta) \quad (4)$$

When f(k) given by Equation (4) is Fourier-transformed, the phase of fat relative to that of water is in advance by θchem×a for the F(0) term, and is behind by θchem×(1−a) for the F(1) term. Therefore, water and fat can be separated by SQFWI using this phase difference.

In this case, TE and TR must be set so that θchem×a=2π/m1 and θchem×(1−a)=2π/m2. The symbols m1 and m2 designate integers not less than two.

θchem×a=2π/m1 is achieved by setting the echo time TE to 1/m1 of the time at which the phase difference between water and fat reaches 2π. θchem×(1−a)=2π/m2 is achieved by setting the difference between the pulse repetition time TR and echo time TE to 1/m2 of the time at which the phase difference between water and fat reaches 2π.

An echo in the SSFP state includes an FID (free induction decay) component and a spin-echo (SE) or stimulated-echo (STE) component. The FID component is also referred to as a gradient echo. The spin-echo or stimulated-echo component is also referred to simply as a spin echo.

Since the effect of magnetic field inhomogeneity on these components is symmetric, a phase offset and an echo time offset due to magnetic field inhomogeneity often occur. The phase offset and time offset between the two components hampers obtainment of a proper echo, and therefore, in general, the phase and time are matched between the two components before imaging. In matching the phase and time, the phase offset and time offset for the FID component and those for SE/STE component are first measured.

Figure 8:
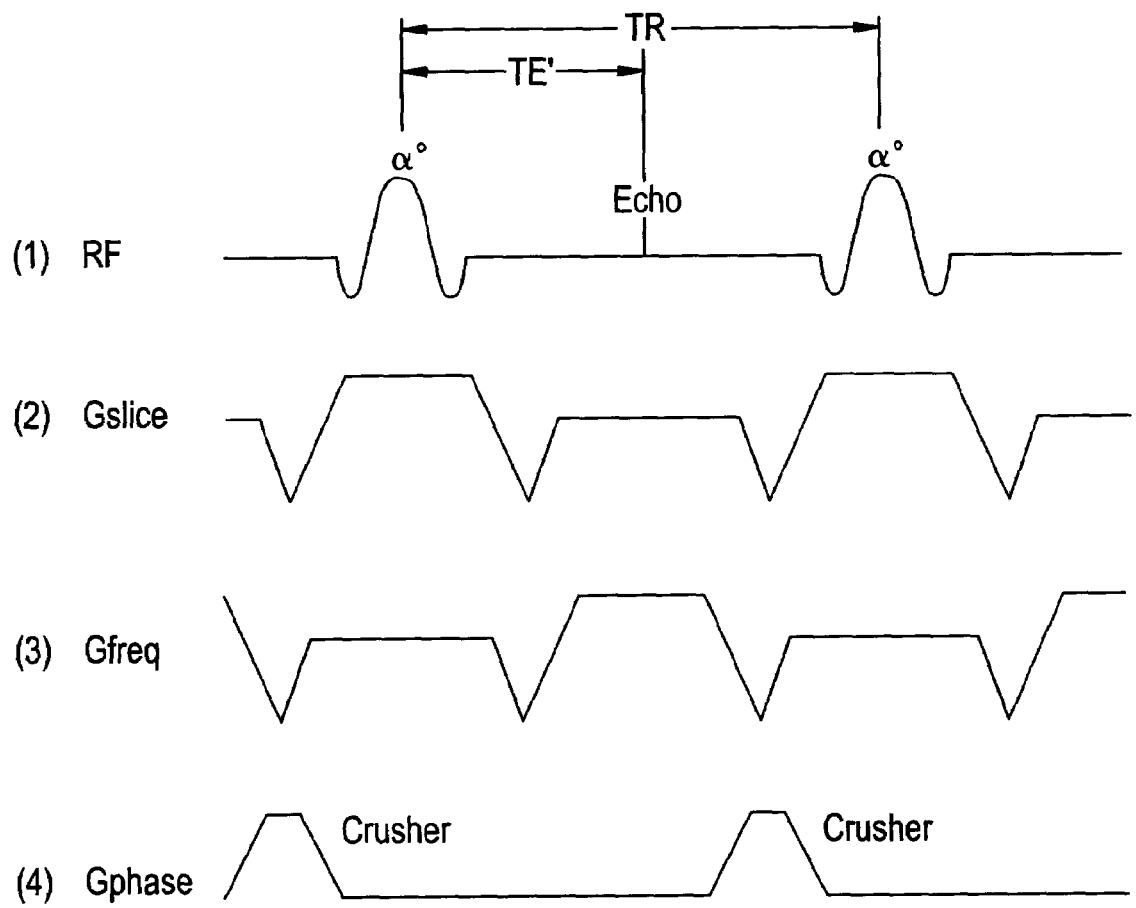
FIG. 8 shows a pulse sequence for measuring an FID.

FIG. 8 shows a pulse sequence for measuring the phase offset and time offset for the FID component. The pulse sequence is the same as an imaging sequence in the SSFP state having a crusher gradient applied to the phase encoding axis in place of a phase encoding gradient.

The crusher is applied immediately before the α° pulse. This achieves phase reset for the SE/STE component to yield an echo consisting only of the FID component. By then measuring the phase offset and time offset in this echo based on an echo time TE', the phase offset and time offset in the FID can be obtained.

Figure 9:
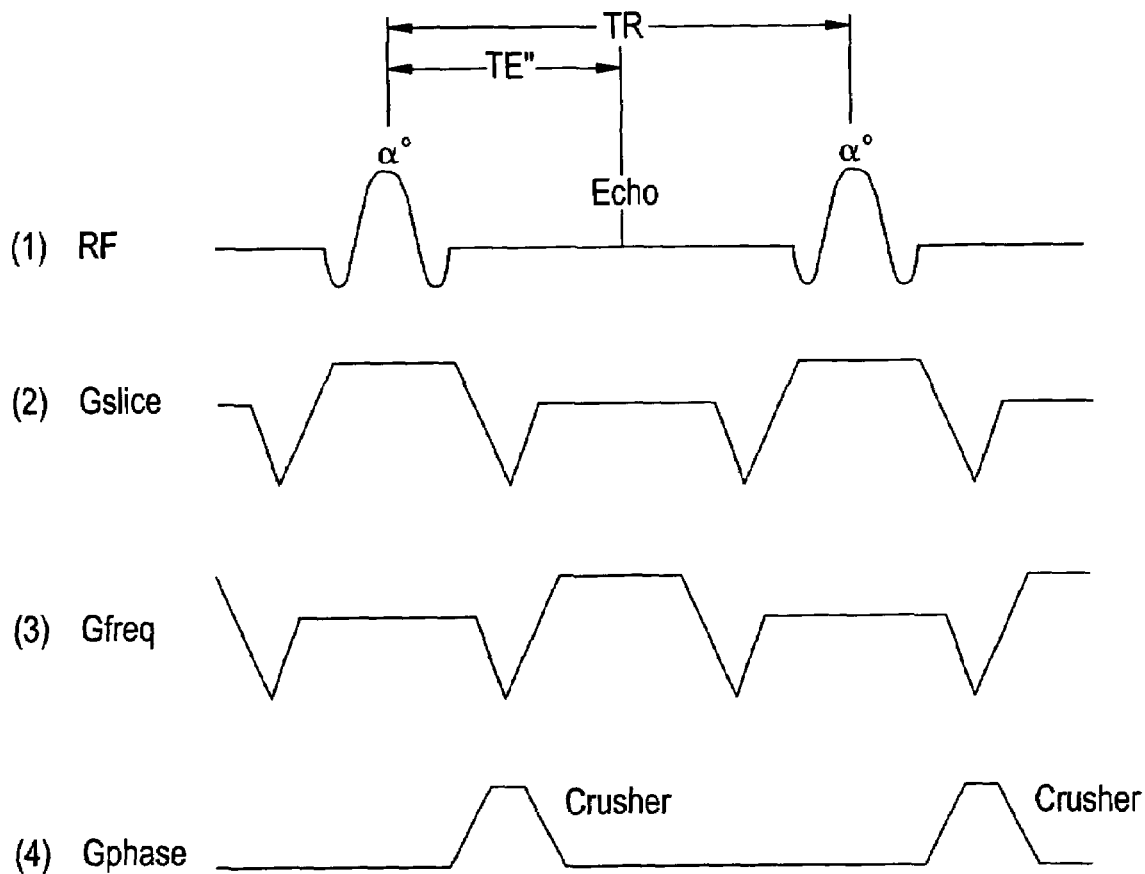
FIG. 9 shows a pulse sequence for measuring an SE/STE.

FIG. 9 shows a pulse sequence for measuring the phase offset and time offset for the SE/STE component. The pulse sequence is the same as an imaging sequence in the SSFP state having a crusher gradient applied to the phase encoding axis in place of a phase encoding gradient.

The crusher is applied immediately after the α° pulse. This achieves phase reset for the FID component to yield an echo consisting only of the SE/STE component. By then measuring the phase offset and time offset in this echo based on an echo time TE", the phase offset and time offset in the SE/STE can be obtained.

Figure 10:
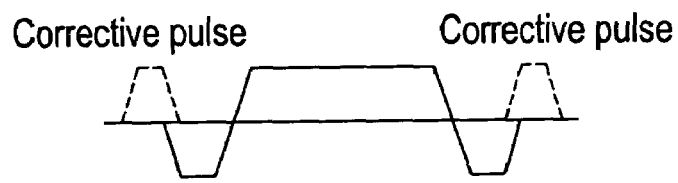
FIG. 10 shows signals for correcting the difference between the FID and SE/STE.

The differences between the phase offsets and between the time offsets represent the phase difference and time difference between the FID and SE/STE components. The time matching between the components is achieved by adjusting the gradient magnetic field. Specifically, as shown in FIG. 10(1), an appropriate corrective pulse is added to the frequency encoding gradient Gfreq to achieve the time matching. The polarity of the corrective pulse may be opposite to that shown in FIG. 10 depending upon the direction of the time offset. The time matching is achieved by adjusting the phase of the α° pulse.

Figure 11:
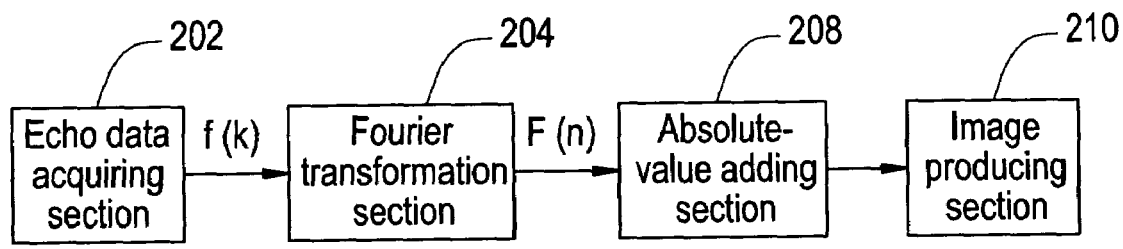
FIG. 11 is a functional block diagram of an apparatus in accordance with one embodiment of the present invention.

FIG. 11 shows a functional block diagram of the present apparatus. As shown, the present apparatus comprises an echo data acquiring section 202. The echo data acquiring section 202 executes echo data acquisition in the SSFP state by the phase cycle process as described earlier. The echo data acquiring section 202 corresponds to a function of a portion comprised of the magnet system 100 (100'), gradient driving section 130, RF driving section 140, data collecting section 150 and sequence control section 160. The echo data acquiring section 202 is an embodiment of the acquiring means of the present invention.

Echo data f(k) acquired by the echo data acquiring section 202 is input to a Fourier transformation section 204. The Fourier transformation section 204 executes Fourier transformation on the echo data f(k) as described earlier. The Fourier transformation section 204 corresponds to a function of the data processing section 170. The Fourier transformation section 204 is an embodiment of the transforming means of the present invention.

Output data F(n) from the Fourier transformation section 204 is input to an absolute-value adding section 208. The absolute-value adding section 208 executes absolute-value addition on F(0) and F(1) terms. The absolute-value adding section 208 corresponds to a function of the data processing section 170. The absolute-value adding section 208 is an embodiment of the adding means of the present invention.

Output data from the absolute-value adding section 208 is input to an image producing section 210. The image producing section 210 produces an image based on the input data. The image producing section 210 corresponds to a function of the data processing section 170. The image producing section 210 is an embodiment of the image producing means of the present invention.

Figure 12:
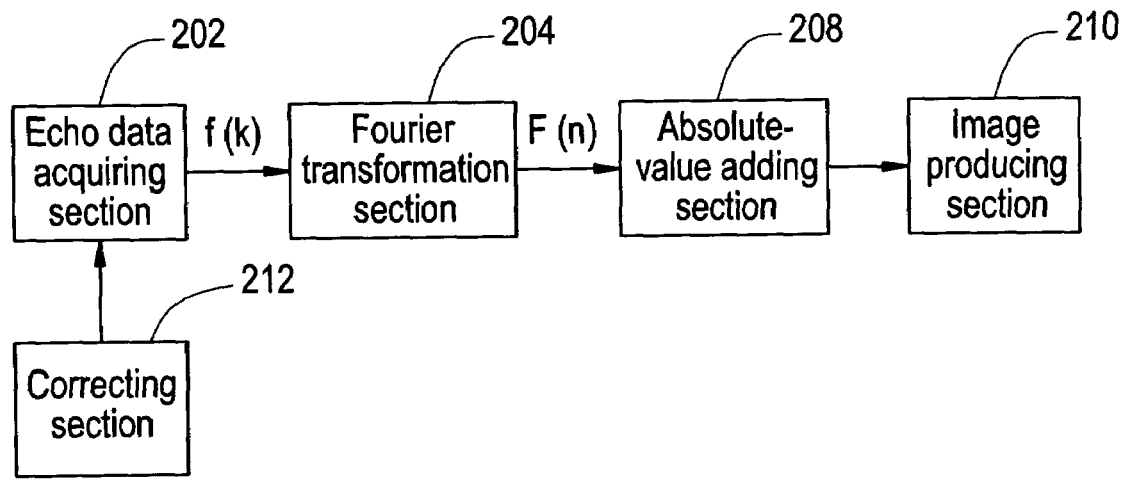
FIG. 12 is a functional block diagram of an apparatus in accordance with another embodiment of the present invention.

FIG. 12 shows another functional block diagram of the present apparatus. In FIG. 12, sections similar to those shown in FIG. 11 are designated by similar reference numerals and explanation thereof will be omitted. As shown, the present apparatus comprises a correcting section 212. The correcting section 212 executes phase matching and time matching between gradient echo (FID) and spin echo (SE/STE) as described earlier.

The correcting section 212 corresponds to a function of a portion comprised of the magnet system 100 (100'), gradient driving section 130, RF driving section 140, data collecting section 150, sequence control section 160 and data processing section 170. The correcting section 212 is an embodiment of the correcting means of the present invention.

Figure 13:
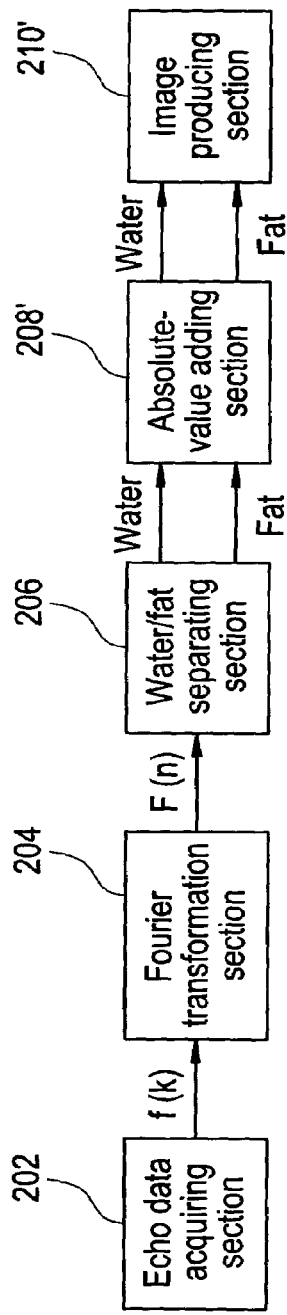
FIG. 13 is a functional block diagram of an apparatus in accordance with still another embodiment of the present invention.

FIG. 13 shows still another functional block diagram of the present apparatus. In FIG. 13, sections similar to those shown in FIG. 11 are designated by similar reference numerals and explanation thereof will be omitted. As shown, the present apparatus comprises a water/fat separating section 206. The water/fat separating section 206 executes water/fat separation by SQFWI respectively on data F(0) and F(1) as described earlier. The water/fat separating section 206 corresponds to a function of the data processing section 170. The water/fat separating section 206 is an embodiment of the separating means of the present invention.

Separated water data and fat data are input to an absolute-value adding section 208'. The absolute-value adding section 208 executes absolute-value addition on water and fat for F(0) and F(1) terms, respectively. The absolute-value adding section 208' corresponds to a function of the data processing section 170. The absolute-value adding section 208' is an embodiment of the adding means of the present invention.

Output data from the absolute-value adding section 208 are input to an image producing section 210'. The image producing section 210' produces a water image and a fat image based on the input data. Only one of the water and fat images may be produced. The image producing section 210' corresponds to a function of the data processing section 170. The image producing section 210' is an embodiment of the image producing means of the present invention.

Figure 14:
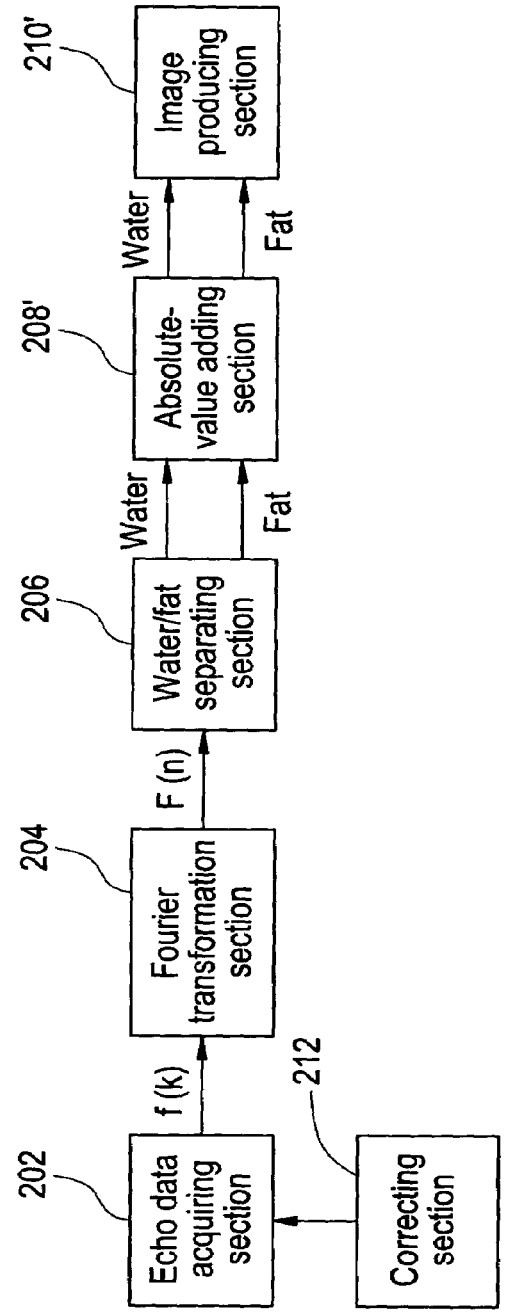
FIG. 14 is a functional block diagram of an apparatus in accordance with still another embodiment of the present invention.

FIG. 14 shows still another functional block diagram of the present apparatus. In FIG. 14, sections similar to those shown in FIG. 13 are designated by similar reference numerals and explanation thereof will be omitted. As shown, the present apparatus comprises a correcting section 212. The correcting section 212 executes phase matching between gradient echo (FID) and spin echo (SE/STE) as described earlier.

The correcting section 212 corresponds to a function of a portion comprised of the magnet system 100 (100'), gradient driving section 130, RF driving section 140, data collecting section 150, sequence control section 160 and data processing section 170. The correcting section 212 is an embodiment of the correcting means of the present invention.

While the present invention has been described with reference to preferred embodiments hereinabove, various changes or substitutions may be made on these embodiments by those ordinarily skilled in the art pertinent to the present invention without departing from the technical scope of the present invention. Therefore, the technical scope of the present invention encompasses not only those embodiments described above but all that fall within the scope of the appended claims.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging apparatus comprising:
an acquiring device for acquiring echo data of a plurality of views with spins within a subject brought to an SSFP state and repeating the acquisition for k=0 through M−1 (M being an integer not less than two; k=0, 1, . . . , M−1) with a step difference in a phase of an RF pulse of 2π·k/M;
a transforming device for conducting Fourier transformation on the echo data based on said phase;
a separating device that corrects a phase error by a phase distribution multiplied by 1/m, after multiplying the phase of the Fourier-transformed data by m to make water and fat in phase and correcting wraparound of a portion beyond a range of ±π,
an adding device for obtaining a sum of absolute values of F(0) term and F(1) term of the Fourier-transformed data; and
an image producing device for producing an image based on the sum data.

2. The magnetic resonance imaging apparatus of claim 1, wherein M=4.

3. The magnetic resonance imaging apparatus of claim 1, wherein said transforming device conducts Fourier transformation from the F(0) term to F(1) term.

4. The magnetic resonance imaging apparatus of claim 1, further comprising: correcting device for correcting a phase offset and a time offset between a gradient echo and a spin echo.

5. The magnetic resonance imaging apparatus of claim 4, wherein said correcting device corrects the phase offset and the time offset by finding them from a phase and an echo time of the gradient echo when the phase of the spin echo is reset by a crusher, and a phase and an echo time of the spin echo when the phase of the gradient echo is reset by a crusher.

6. The magnetic resonance imaging apparatus of claim 5, wherein said correcting device corrects the phase offset by the phase of the RF pulse, and corrects the time offset by a gradient magnetic field.

7. A magnetic resonance imaging apparatus comprising:
an acquiring device for acquiring echo data of a plurality of views in which a phase difference between water and fat is 2π/m (m≧2) with spins within a subject brought to an SSFP state and repeating the acquisition for k=0 through M−1 (M being an integer not less than two; k=0, 1, . . . , M−1) with a step difference in a phase of an RF pulse of 2π·k/M;
a transforming device for conducting Fourier transformation on the echo data based on said phase;
a separating device for separating water data and fat data respectively in F(0) term and F(1) term of the Fourier-transformed data using the phase difference between water and fat, said separating device corrects a phase error by a phase distribution multiplied by 1/m, after multiplying the phase of the Fourier-transformed data by m to make water and fat in phase and correcting wraparound of a portion beyond a range of ±π,
an adding device for obtaining a sum of absolute values of at least the water data or fat data in the F(0) term and F(1) term; and
an image producing device for producing an image based on the sum data.

8. The magnetic resonance imaging apparatus of claim 7, wherein said acquiring device acquires the echo data with an echo time TE of 1/m1 (m1≧2) of a time at which the phase difference between water and fat reaches 2π, and acquires the echo data a with a difference between a pulse repetition time TR and an echo time TE of 1/m2 (m2≧2) of a time at which the phase difference between water and fat reaches 2π.

9. The magnetic resonance imaging apparatus of claim 8, wherein m1=m2=4.

10. The magnetic resonance imaging apparatus of claim 8, wherein the echo time TE is equal to the pulse repetition time TR multiplied by α(αm2/(m1+m2)).

11. The magnetic resonance imaging apparatus of claim 8, wherein the echo time TE is ½ (m1=m2) of the pulse repetition time TR.

12. The magnetic resonance imaging apparatus of claim 7, wherein said separating device separates water data and fat data after correcting the phase error in the Fourier-transformed data due to magnetic field inhomogeneity.

13. The magnetic resonance imaging apparatus of claim 7, wherein said adding device obtains a sum of absolute values of the water data in the F(0) term and F(1) term.

14. The magnetic resonance imaging apparatus of claim 7, wherein said adding device obtains a sum of absolute values of the fat data in the F(0) term and F(1) term.

15. The magnetic resonance imaging apparatus of claim 7, wherein said adding device obtains respective sums of absolute values of the water data and fat data in the F(0) term and F(1) term, and said image producing device produces respective images based on the respective sum data.

16. The magnetic resonance imaging apparatus of claim 7, wherein said transforming device conducts Fourier transformation from the F(0) term to F(1) term.

17. The magnetic resonance imaging apparatus of claim 7, further comprising: correcting device for correcting a phase offset and a time offset between a gradient echo and a spin echo.

18. The magnetic resonance imaging apparatus of claim 17, wherein said correcting device corrects the phase offset and the time offset by finding them from a phase and an echo time of the gradient echo when the phase of the spin echo is reset by a crusher, and a phase and an echo time of the spin echo when the phase of the gradient echo is reset by a crusher.

19. The magnetic resonance imaging apparatus of claim 18, wherein said correcting device corrects the phase offset by the phase of the RF pulse, and corrects the time offset by a gradient magnetic field.

* * * * *